United States Patent
Sager-Hintermann et al.

(10) Patent No.: US 6,860,075 B2
(45) Date of Patent: Mar. 1, 2005

(54) DEVICE FOR SURFACE TREATMENT AND/OR COATING AND/OR PRODUCING CONSTRUCTION ELEMENTS, IN PARTICULAR, FLAT CONSTRUCTION ELEMENTS OF GLASS, GLASS ALLOYS OR METALS, BY A CONTINUOUS PROCESS

(75) Inventors: Kurt Sager-Hintermann, Dürrenäsch (CH); Emil Bächli, Marktgasse 7, CH-5304 Endingen (CH)

(73) Assignee: Emil Bächli, Endingen (CH)

( * ) Notice: Subject to any disclaimer, the term of this patent is extended or adjusted under 35 U.S.C. 154(b) by 266 days.

(21) Appl. No.: 09/775,310

(22) Filed: Feb. 1, 2001

(65) Prior Publication Data

US 2001/0027750 A1 Oct. 11, 2001

(30) Foreign Application Priority Data

Feb. 1, 2000 (EP) .......................................... 00810091

(51) Int. Cl.⁷ ................................................ E04B 2/00
(52) U.S. Cl. ....................... 52/506.11; 118/64; 52/250; 52/251; 52/600; 52/596; 52/612; 52/723.1
(58) Field of Search .......................... 52/250, 251, 600, 52/596, 612, 723.1, 506.11; 118/64

(56) References Cited

U.S. PATENT DOCUMENTS 4,136,492 A * 1/1979 Willingham ................. 52/79.7
5,263,297 A * 11/1993 Kim ............................ 52/723.1

FOREIGN PATENT DOCUMENTS

DE         2833231         3/1979

OTHER PUBLICATIONS

Leybold–Heraeus GMBH, Hanau, Germany, 14–200.1/2 Dated May 5, 1982.
Laybold–Heraeus GMBH, Hanau, Germany, 14–300.1 Dated Oct. 5, 1983.

* cited by examiner

Primary Examiner—Carl D. Friedman
Assistant Examiner—Steve Varner
(74) Attorney, Agent, or Firm—Friedrich Kueffner

(57) ABSTRACT

A device for surface-treating, coating or producing construction elements in a continuous process has production chambers arranged successively closely adjacent to one another in a direction of transport of the construction elements through the device. Each production chamber has opposed ends with through openings and is connectable to a vacuum source. Each production chamber has a stationary chamber part of reinforced concrete and a detachable chamber part of reinforced concrete connected to the stationary chamber part, wherein the stationary chamber parts have first edge areas and the detachable chamber parts have second edge areas, wherein the first and second edge areas have sealing surfaces sealing the stationary and detachable chamber parts relative to one another. Each production chamber has walls defining a hollow interior, wherein the walls consist of a metallic skin anchored in the stationary and detachable chamber parts, respectively. A chamber part is produced by placing the skin onto a straightening plate in a formwork and then pouring concrete on top. The straightening plate is manufactured by pouring epoxide resin into a frame to form a flat surface.

11 Claims, 2 Drawing Sheets

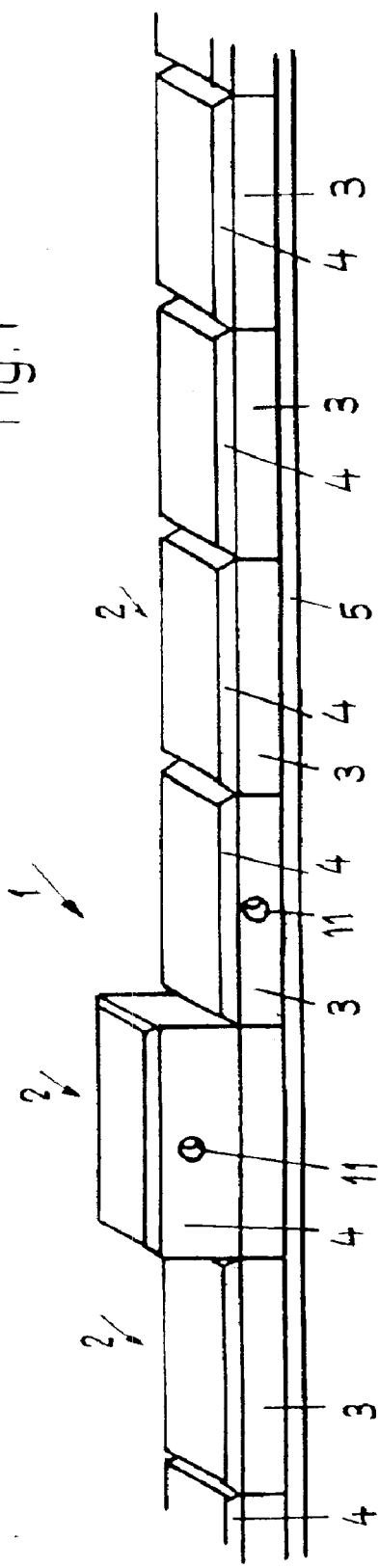
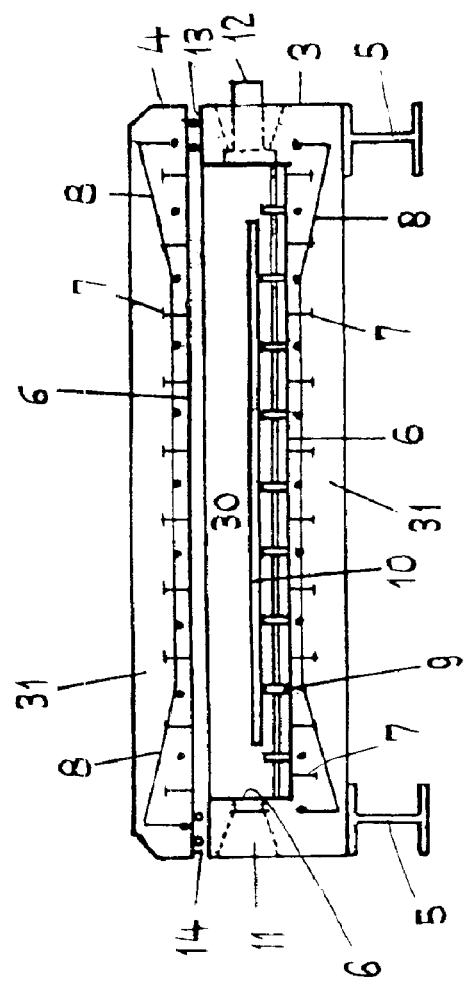

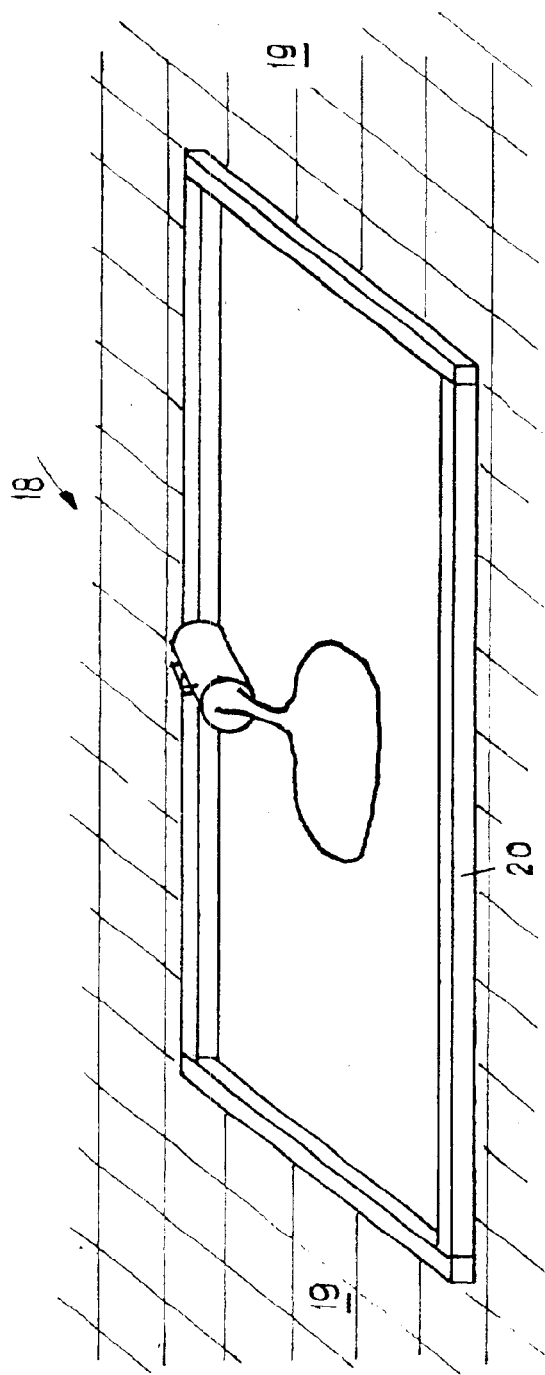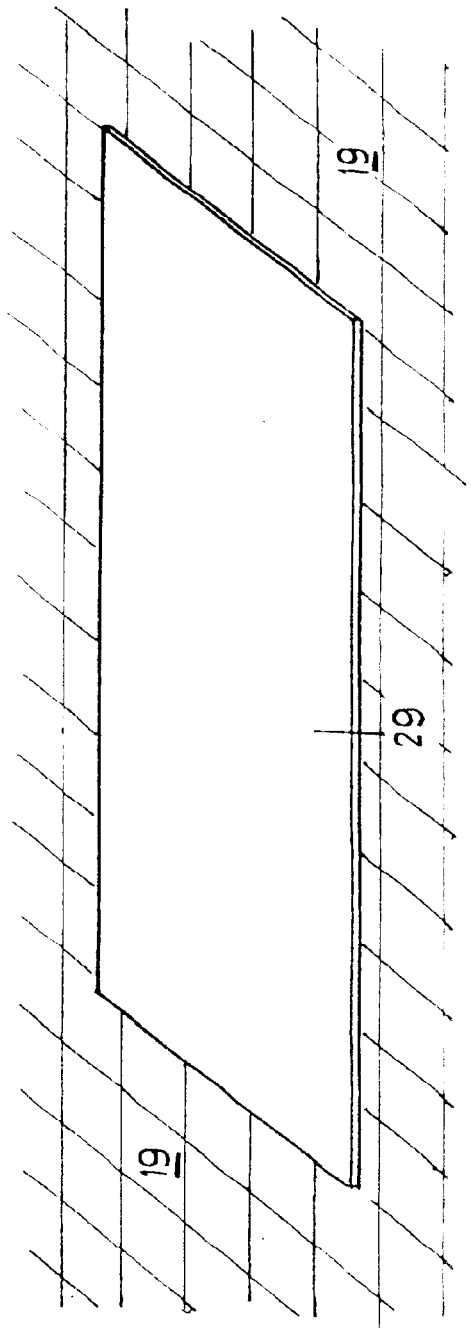

DEVICE FOR SURFACE TREATMENT AND/OR COATING AND/OR PRODUCING CONSTRUCTION ELEMENTS, IN PARTICULAR, FLAT CONSTRUCTION ELEMENTS OF GLASS, GLASS ALLOYS OR METALS, BY A CONTINUOUS PROCESS

BACKGROUND OF THE INVENTION

1. Field of the Invention

The invention relates to a device for surface treatment and/or coating and/or producing construction elements, in particular, flat construction elements of glass, glass alloys or metal, by a continuous process, wherein the device is comprised of several production chambers arranged successively and closely adjacent to one another in the transport direction of the substrates and having at their ends through openings. The production chambers are comprised of a stationary chamber part and a detachable chamber part. They are connectable to a vacuum source. The production chamber is delimited by metallic walls, and the chamber parts are formed in their edge area with oppositely positioned sealing surfaces.

2. Description of the Related Art

Devices of this kind are used, inter alia, by Leybold-Heraeus GmbH, Hanau, Germany, as so-called continuous processing devices for coating of sheet or plate glass and are described in more detail in the brochure 14-200.1/2 dated May 5, 1982. In the introductory portion of this brochure reference is made to the energy exchange in the area of windows of a building. In this connection, in temperate and cold climate zones, especially in winter, energy costs are to be saved by reducing the heat loss. However, in warm countries the sun ray transmission is to be reduced significantly in order to keep the room temperature low. This also requires a lot of energy. Subsequently, heat-reflecting coatings as well as coating methods and coating devices employed therefor are described.

In a further brochure 14-300.1, dated Oct. 5, 1983, of the same company, a device of the aforementioned kind is described with the aid of a drawing. The device is comprised of several production chambers 3 to 11 which are successively arranged closely adjacent to one another from the right to the left in the transport direction of the substrates or the glass panes. A washing device and a buffer station are arranged upstream thereof, and a buffer station and an optical quality control device are arranged downstream thereof. This device is characterized inter alia by high cost efficiency, universal range of application, short cycle times, high degree of automation, high comfort of operation, environmentally safe operation, and high-quality standard of the coated sheet or plate glass. For the disclosed coating method horizontal or vertical continuous processes are offered. Color-neutral heat reducing coatings, decorative, colored sun protection coatings as well as coatings for automotive glass can be applied by these continuous processing methods.

Devices of this kind are also used for the manufacture of absorbers, photovoltaic devices, and other manufacturing processes carried out in vacuum.

The disclosed processing chambers which, as a result of a high vacuum, are subjected to high pressure loading from the exterior, require a correspondingly high construction expenditure. For this purpose, the lower chamber parts which are positioned on frames on the floor and form the hollow space or interior of a production chamber are formed by strong lateral profiled supports and by rib-shaped strips extending at the underside of the bottom in a transverse direction. The upper chamber part which rests on the lower chamber part is similar to a cover and provided with a large number of ribs for maintaining the required high strength during production of the glass panes passing through on a roll table. For opening the production chambers, the upper chamber parts are connected by a pivotable arm to the lower chamber parts. The individual production chambers are connected by slot-like through openings in order to allow transport of the glass panes through the device. At the inlet and outlet ends of the device the openings for the incoming and exiting construction elements are provided with actuatable flaps in order to be able to keep flooding of the production chambers in check, i.e., within acceptable limits. Between the chamber parts and the individual production chambers seals are arranged which are indispensable for maintaining the vacuum required for the manufacturing or coating process.

For the proper function of this known device, which is manufactured exclusively of high-quality construction steel with a high weight, a high construction expenditure is required which ensures a high strength and tightness between the chamber parts of a production chamber and between the production chambers. After completion of the extensive welding labor on the chamber parts, the resulting warping of the welding construction requires a cutting machining for producing flat sealing surfaces. However, this machining can only be performed on machine tools which have a clamping surface area that is larger than the surface area of the chamber parts placed thereon.

SUMMARY OF THE INVENTION

It is an object of the present invention to provide a device of the aforementioned kind which requires a considerably simplified and reduced construction expenditure.

In accordance with the present invention, this is achieved in that the walls of the hollow interior or hollow space of a production chamber are formed by a metallic skin which is anchored, respectively, within the chamber parts consisting of reinforced concrete.

An after-machining of the sealing surfaces is no longer required.

Such a production chamber, which is designed to accommodate, for example, sheet or plate glass of a surface area of 4 m×6 m, is evacuated to a vacuum of up to $10^{-5}$ mbar so that a high pressure acts on the production chamber from the exterior. The skin in the hollow interior is formed of several wall parts welded to be vacuum-tight.

Advantageously, the metallic skin is fastened to anchoring elements, for example, bolts or anchors, embedded in the concrete. In this connection, the reinforcement of the concrete can be comprised of a network of round steel and can be connected with the anchoring elements.

Advantageously, the hollow interior is formed by a tub-shaped and/or hood-shaped chamber part. In this connection, it appears to be simpler when the hollow interior is provided in only one of the chamber parts.

It is particularly beneficial when at least the stationary chamber part has a hollow interior by which the corresponding chamber part becomes heavier than the other chamber part.

Expediently, the sealing surfaces of the chamber parts are comprised of the metallic skin of the production chamber extending into the sealing area and forming the walls of the hollow interior, i.e., the sealing surfaces adjoin the skin which forms the walls of the hollow interior, so that the manufacture of the chamber parts is again simplified and after-machining of sealing surfaces is no longer required.

For the removal of process heat, it is advantageous to provide a line which connects the hollow interior with the ambient and which is closeable.

Preferably, the metallic skin is comprised of stainless-steel which in vacuum has a reduced gas emission rate in comparison to construction steel so that the energy expenditure during evacuation of the closed hollow interior is considerably smaller than in known production chambers. Moreover, a smooth stainless-steel surface can be cleaned more easily.

Flange-like sealing surfaces with intermediately positioned flat or round seals of an elastic material are simple and especially suitable sealing devices.

As an apparatus for producing a device according to the invention, a planar or flat straightening plate for placement of the metallic skin of a chamber part during anchoring of the metallic skin by pouring of concrete for forming the chamber part is advantageous, in particular, when for the production of the straightening plate a frame, that can be placed tightly on a flat surface and is configured to receive curable plastic resin, is provided for forming a planar or flat plate surface. With this measure, the manufacture of the production chambers for the device according to the invention can be carried out on site where later on the production of the construction elements is realized with the device according to the invention. In this way, a cost-intensive transport of the production chambers to the production location can also be eliminated.

For producing the device, a method is preferably employed in which the skin of a chamber part is placed onto the straightening plate in a formwork, and, subsequently, the pourable concrete is supplied.

This method can be simplified when the skin forming a hollow interior of a chamber part is positioned such that the sealing surface faces the straightening plate. When one of the chamber parts does not have a hollow space, the stretched skin is placed as a wall portion of the production chamber onto the straightening plate.

When the skin forms a hollow interior of a chamber part, the wall of the hollow interior facing the straightening plate is to be supported on the straightening plate before supplying the concrete for molding the chamber part to the formwork.

In the following, the invention will be explained with respect to one embodiment with the aid of the drawing, and reference is being had to the drawing with respect to all details which are not described in more detail in the following description.

BRIEF DESCRIPTION OF THE DRAWING

In the drawing:

FIG. 1 shows a device for surface treatment, coating, and/or producing flat construction elements;

FIG. 2 is a cross-section of the device illustrated in FIG. 1;

FIG. 3 shows an apparatus for producing a straightening plate for the manufacture of the device illustrated in FIGS. 1 and 2; and FIG. 4 shows the straightening plate produced according to the method illustrated in FIG. 3.

DESCRIPTION OF THE PREFERRED EMBODIMENTS

FIG. 1 illustrates a device 1 for surface treatment and/or coating and/or producing construction elements, in particular, of glass, glass alloys or metal, which pass in a continuous process through several production chambers 2 which are arranged successively and closely adjacent to one another. The manufacturing chambers 2 comprise each a stationary (lower) chamber part 3 and a (upper) chamber part 4 that is detachable from the stationary chamber part 3. As in the known devices, the chamber part 4 can be connected pivotably to the chamber part 3 so as to be pivotal to one side or can be lifted by means of a crane from the stationary chamber part 3. In the embodiment illustrated in FIG. 1, the flat construction elements are guided horizontally through the device 1. Of course, with a corresponding arrangement of the device 1, the construction elements can also be vertically positioned and passed upright through the device.

The production chamber 2 of the device 1, illustrated in cross-section in FIG. 2, rests with a stationary chamber part 3 on two parallel supports 5. The stationary chamber part 3 has a hollow space 30 open in the upward direction which is delimited by a stainless steel skin 6 formed of sheet metal. This skin 6 is connected by means of anchoring elements 7 with the chamber part 3 which is formed of reinforced concrete 31. The anchoring elements 7 are advantageously connected by known welding methods, for example, with a so-called bolt welding apparatus, to the skin 6. The reinforcement of steel can be fastened to the anchoring elements; it is illustrated in FIG. 2 and identified by reference numeral 8. Within the chamber part 3 a roll table 9, comprised of several rolls which are mounted on shafts extending transversely to the transport direction of the construction elements, is provided on which the flat construction elements are transported and processed. In the transport direction of the construction elements, the ends of the chamber parts 3 have slot-shaped through openings 10 which can be closed by flaps (not illustrated but well-known in the art).

With regard to their respective function, there is no significant difference between the device 1 and its production chambers 2 disclosed herein and the known prior art devices. The difference resides essentially in the design and configuration of the production chamber 2. However, it is not mandatory to provide the hollow space 30 in the lower chamber part 3; it could also be provided in the upper chamber part 4 which can be lifted off (detached from) the lower chamber part 3.

Moreover, FIGS. 1 and 2 show a viewport 11 for monitoring the hollow space 30 or the process taking place in the hollow space. Also shown is a connector socket 12 communicating with the hollow space 30 and configured to be connected to a vacuum pump. As is illustrated moreover in FIG. 2, the detachable chamber part 4 formed of reinforced concrete 31 is provided at the surface facing the stationary chamber part 3 also with a metallic skin 6 which is anchored in the same way and forms in the edge area of the chamber part 4 a sealing surface 13. The sealing surface 13 and the sealing surface 14, formed on the stationary chamber part 3 by the correlated skin 6, are configured for intermediate positioning of an endless peripheral flat seal or, as illustrated, an endless peripheral round seal 15.

In order to be able to open individual manufacturing chambers 2 during processing of the construction elements without flooding the remaining production chambers 2, the ends of the production chambers 2, in particular, the chamber part 3, 4 having the through openings 10, are formed with an actuatable or controllable closure flap or a slide.

In FIG. 2 the possibility of a pivot movement of the chamber part 4 during lifting or detachment from the chamber part 3 is illustrated in dash-dotted lines.

FIG. 1 shows in the device 1 a processing chamber 2 that is taller than the others. It is possible to turn a construction element to be treated in this taller chamber and/or to machine the construction element in this taller chamber with a special device.

The production chambers 2, producible according to the construction principle of the invention, make it possible to produce them on site where they are later on needed for treatment and processing of the construction elements.

FIGS. 3 and 4 describe a possibility of producing with a special apparatus 18 a straightening plate 29 with which the precise spacing between the sealing surfaces 13, 14 of the chamber parts 3, 4 can be obtained, this being required for absolute tightness of the hollow space 30 of the production chamber 2. In this connection, a frame 20 with a foil (not illustrated) provided for sealing relative to the ground 19 can be positioned on a planar ground 19. The inner width of the frame 20 is greater than the surface which is required for the dimensions of the chamber parts 3, 4. A curable epoxides resin or something similar is poured into the frame 20 and expands toward the frame 20 to thereby form an absolutely flat horizontal surface. When the resin has cured, a straightening plate 29 is realized which is now suitable for construction of the formwork (not illustrated). Into the formwork which has the size of the chamber parts 3, 4, the flat or the pre-shaped skin 6 of a chamber part 3, 4 is placed onto the straightening plates 29. In the embodiment illustrated in FIGS. 1 and 2, the skin 6 provided with a hollow space 30 or the planar skin 6 ends at the formwork. Onto the skin 6 with the upwardly oriented anchoring elements 7 and the reinforcement network, concrete 31 is poured which is subsequently to be compacted. Concrete 31 ensures, as a result of its weight and the reinforcement, stress-free planar sealing surfaces 13, 14 on the chamber parts 3, 4 so that a precise or uniforms sealing gap between the sealing surfaces 13, 14 is formed.

In the case of a skin 6 forming a hollow space 30, the wall of the hollow space 30 facing the straightening plate 29 is to be supported before fresh concrete 31 is poured into the formwork.

While specific embodiments of the invention have been shown and described in detail to illustrate the inventive principles, it will be understood that the invention may be embodied otherwise without departing from such principles.

What is claimed is:

1. A device for surface-treating, coating or producing construction elements in a continuous process, the device comprising:

production chambers arranged successively closely adjacent to one another in a direction of transport of the construction elements through the device;

each one of the production chambers having opposed ends with through openings;

each one of the production chambers configured to be connected to a vacuum source;

each one of the production chambers comprised of a stationary chamber part of reinforced concrete and a detachable chamber part of reinforced concrete connected to the stationary chamber part, wherein the stationary chamber part has first edge areas and the detachable chamber part has second edge areas, wherein the first and second edge areas have sealing surfaces configured to seal the stationary and detachable chamber parts relative to one another;

each one of the production chambers having walls defining a hollow interior, wherein the walls consist of a metallic skin anchored in the stationary and detachable chamber parts, respectively.

2. The device according to claim 1, wherein the stationary and detachable chamber parts comprise anchoring elements embedded by the reinforced concrete and wherein the metallic skin is fastened to the anchoring elements.

3. The device according to claim 1, wherein at least one of the stationary chamber part and the detachable chamber part of each one of the production chambers is tub-shaped or hood-shaped so as to form the hollow interior of the production chamber.

4. The device according to claim 1, wherein at least the stationary chamber part is provided with the hollow interior.

5. The device according to claim 1, wherein the first and second edge areas are flanges having sides facing one another and wherein the sealing surfaces are located on the sides facing one another.

6. The device according to claim 5, wherein the sealing surfaces are formed by the metallic skin.

7. The device according to claim 1, wherein each one of the production chambers further comprises a seal arranged between the sealing surfaces.

8. The device according to claim 1, wherein each one of the production chambers comprises a closeable line in communication with ambient air.

9. The device according to claim 1, wherein the metallic skin consists of stainless steel.

10. The device according to claim 1, wherein the through openings have closure flaps configured to separate the hollow interiors of the production chambers from one another.

11. An apparatus for manufacturing a device according to claim 1, the apparatus comprised of:

a flat straightening plate configured to receive the metallic skin of one of the chamber parts during pouring of the concrete to form the chamber part and to anchor the metallic skin in the concrete, wherein a frame, configured to be tightly placed onto a flat surface, is provided to receive a curable epoxide resin for forming a planar plate surface of the flat straightening plate.

* * * * *